(12) United States Patent
Kuriyama

(10) Patent No.: US 7,473,944 B2
(45) Date of Patent: Jan. 6, 2009

(54) SOLID-STATE IMAGING DEVICE

(75) Inventor: Toshihiro Kuriyama, Otsu (JP)

(73) Assignee: Panasonic Corporation, Osaka (JP)

( * ) Notice: Subject to any disclaimer, the term of this patent is extended or adjusted under 35 U.S.C. 154(b) by 4 days.

(21) Appl. No.: 11/333,924

(22) Filed: Jan. 18, 2006

(65) Prior Publication Data

US 2006/0170018 A1    Aug. 3, 2006

(30) Foreign Application Priority Data

Jan. 28, 2005    (JP)    .............................. 2005-021942

(51) Int. Cl.
*H01L 29/768*    (2006.01)
(52) U.S. Cl. ................. 257/223; 257/232; 257/E29.229
(58) Field of Classification Search ................. 257/215, 257/222, 223, 233, 234, E29.229
See application file for complete search history.

(56) References Cited

U.S. PATENT DOCUMENTS

| 5,288,651 | A | * | 2/1994 | Nakazawa | ................... 438/145 |
| 5,902,995 | A | * | 5/1999 | Morimoto | ................... 250/208.1 |
| 6,215,521 | B1 | * | 4/2001 | Surisawa et al. | ............ 348/314 |
| 6,433,369 | B2 | * | 8/2002 | Jung et al. | ................... 257/215 |
| 6,583,061 | B2 | * | 6/2003 | Stevens | ....................... 438/700 |
| 6,794,219 | B1 | * | 9/2004 | Stevens et al. | ................ 438/75 |
| 2004/0233314 | A1 | * | 11/2004 | Kuriyama | ................... 348/311 |

FOREIGN PATENT DOCUMENTS

| JP | 8-172178 | * | 7/1996 |
| JP | 10-50975 |   | 2/1998 |
| JP | 11-26742 |   | 1/1999 |
| JP | 2004-349333 |   | 12/2004 |

* cited by examiner

*Primary Examiner*—Tuan N. Quach
(74) *Attorney, Agent, or Firm*—Hamre, Schumann, Mueller & Larson, P.C.

(57) ABSTRACT

A solid-state imaging device includes a semiconductor substrate including: a plurality of light-receptive portions that are arranged one-dimensionally or two-dimensionally; a vertical transfer portion that transfers signal electric charge read out from the light-receptive portions in a vertical direction; a horizontal transfer portion that transfers the signal electric charge transferred by the vertical transfer portion in a horizontal direction; a barrier region adjacent to the horizontal transfer portion, the barrier region letting only surplus electric charge of the horizontal transfer portion pass therethough; a drain region adjacent to the barrier region, into which the surplus electric charge passing through the barrier region is discharged; and an insulation film adjacent to the drain region. A portion of the drain region is located beneath the insulation film.

35 Claims, 8 Drawing Sheets

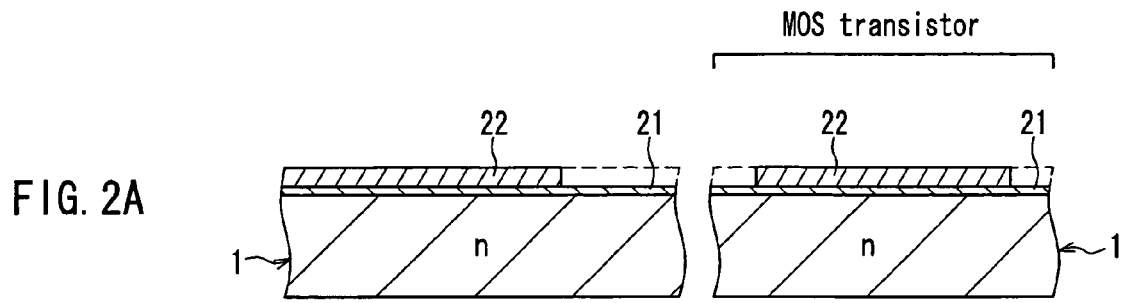
FIG. 2A
FIG. 2B
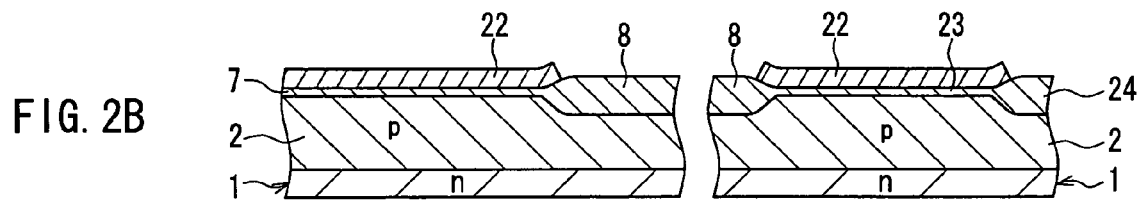
FIG. 2C
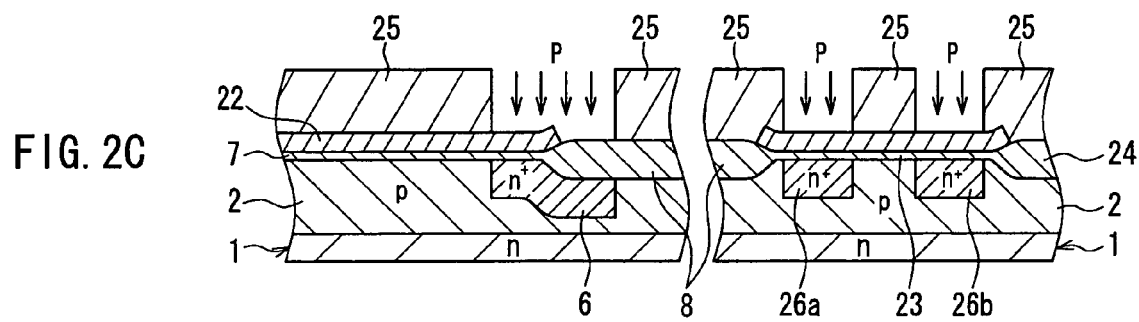
FIG. 2D
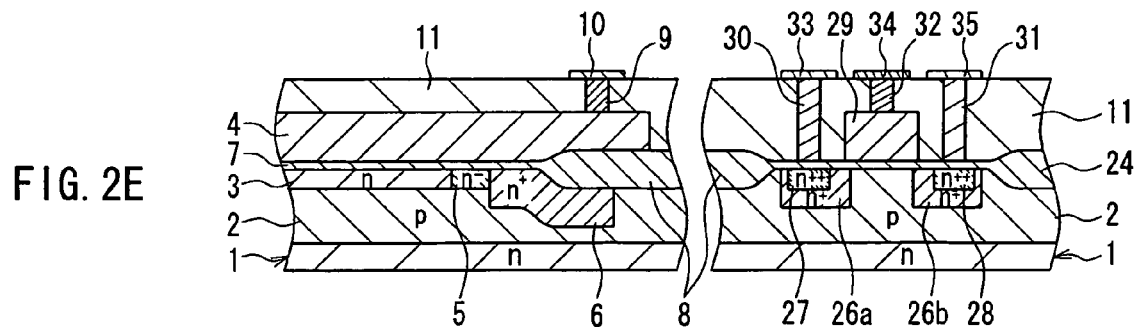
FIG. 2E

SOLID-STATE IMAGING DEVICE

BACKGROUND OF THE INVENTION

1. Field of the Invention

The present invention relates to a solid-state imaging device, and more particularly relates to a charge coupled device (CCD) type solid-state imaging device and a method for manufacturing the same.

2. Description of Related Art

In recent years, demands for solid-state imaging devices have been increasing as imaging devices for digital still cameras and digital video cameras. Further, since there is a request for portable terminal devices such as a cellphone additionally to have a camera function, the demands for solid-state imaging devices have been increasing also for the imaging devices of such portable terminal devices. Furthermore, in order to obtain a high quality image, the number of pixels in a solid-state imaging device has been increased year by year. In addition, in line with the request for lower power consumption of digital still cameras, digital video cameras and portable terminal devices, solid-state imaging devices with lower power consumption also have been demanded.

Referring now to FIGS. 5 to 8, a conventional solid-state imaging device is described below. Firstly, the schematic configuration of the conventional solid-state imaging device is described. FIG. 5 is a plan view showing the schematic configuration of a conventional CCD type solid-state imaging device. As shown in FIG. 5, the CCD type solid-state imaging device has a semiconductor substrate 101. The semiconductor substrate 101 is provided with a plurality of two-dimensionally arranged light-receptive portions 102, a vertical transfer portion (vertical CCD) 103 arranged along each column of the light-receptive portions 102 in the vertical direction and a horizontal transfer portion (horizontal CCD) 104 provided adjacent to the final row of the light-receptive portions 102. The light-receptive portions 102 are photodiodes, which store electric charge in accordance with the intensity of the received light. One light-receptive portion 102 and a part of the adjacent vertical CCD 103 make up one pixel 108.

As shown by arrows of FIG. 5, electric charge stored in the light-receptive portions 102 is read out and transferred in the vertical direction by the vertical CCD 103. The electric charge transferred by the vertical CCD 103 is transferred by the horizontal CCD 104 in the horizontal direction, is amplified by an amplifier 105 and is output to the outside.

Further, as shown in FIG. 5, a drain region 107 is provided across a barrier region 106 on the side of the horizontal CCD 104 that is not adjacent to the vertical CCD 103 (see JP H10(1998)-50975 A, for example). The barrier region 106 is a potential barrier, which lets only surplus electric charge of the horizontal CCD pass therethrough. Therefore, the surplus of the electric charge transferred to the horizontal CCD 104 is discharged to the drain region 107.

Next, specific configurations of the vertical CCD 103, the horizontal CCD 104 and the drain region 107 are described below, with reference to FIGS. 6 and 7. FIG. 6 is an enlarged plan view of a part of the conventional CCD type solid-state imaging device of FIG. 5. FIG. 7 shows the configuration of a part of the conventional CCD type solid-state imaging device in cross section. The cross section of FIG. 7 is taken along the line A-A' of FIG. 6, which illustrates the lines appearing in the cross section only.

As shown in FIG. 6, each of the vertical CCD 103 and the horizontal CCD 104 is configured with a channel region 109 serving as a transfer path of the electric charge and a two-layered transfer electrode. Herein, in FIG. 6, a transfer electrode in the first layer is illustrated with hatching. More specifically, the vertical CCD 103 is made up of a portion 109a of the channel region 109 extending in the vertical direction, a first-layer vertical transfer electrode 112 and a second-layer vertical transfer electrode 113. The vertical CCD 103 is four-phase driven. The horizontal CCD 104 is made up of a portion 109b of the channel region 109 extending in the horizontal direction, a first-layer horizontal transfer electrode 110 and a second-layer horizontal transfer electrode 111. The horizontal CCD 104 is two-phase driven.

As shown in FIG. 7, the semiconductor substrate 101 is a n-type silicon substrate, on which a p-type well 114 is formed. The channel region 109 is formed on the p-type well 114. The channel region 109, the barrier region 106 and the drain region 107 are n-type diffusion layers, and a gate insulation film 115 is formed on these regions. Further, on the side opposite to the channel region 109 with reference to the drain region 107, an insulation film 116 is formed to have a larger thickness than that of the gate insulation film 115. Herein, the insulation film 116 is omitted in FIGS. 5 and 6. The insulation film 116 functions as isolation from a peripheral circuit such as a protective circuit (not illustrated), and the insulation film 116 actually is formed so as to surround the whole major portion including the plurality of light-receptive portions 102, the vertical CCD 103, the horizontal CCD 104, the barrier region 106, the drain region 107 and the like.

Further, as shown in FIGS. 6 and 7, the horizontal transfer electrodes 110 and 111 are formed so as to overlap with the barrier region 106, the drain region 107 and the insulation film 116 along the vertical direction. Moreover, as shown in FIG. 7, the horizontal transfer electrode 110 (and 111) is covered with an insulation film 119. Voltage is applied to the horizontal transfer electrode 110 via a contact 117 provided in the insulation film 119 and an aluminum wiring 118 provided on the contact 117. The contact 117 is provided at a position overlapping with the insulation film 116 serving as isolation. This is because, if the contact 117 is formed at a region overlapping with the gate insulation film 115, the application of voltage might cause dielectric breakdown in the gate insulation film 115.

Now referring to FIG. 8, a method of manufacturing the conventional solid-state imaging device shown in FIGS. 5 to 7 is described below. FIG. 8 shows the manufacturing method of the conventional solid-state imaging device in cross section, in which FIGS. 8A to 8E show a series of major manufacturing steps. Herein, FIG. 8 shows major manufacturing steps concerning a cross-sectional portion taken along the line A-A' of FIG. 6, and these drawings illustrate lines appearing on the cross section only.

Firstly, as shown in FIG. 8A, a silicon oxide film (SiO$_2$) 120 and a silicon nitride film (SiN) 121 are formed successively on the top of a semiconductor substrate 101. Following this, a resist pattern (not illustrated) having an aperture corresponding to the formation region of an insulation film 116 serving as isolation is formed. Etching is applied thereto so as to remove a part of the silicon nitride film 121.

Next, as shown in FIG. 8B, the insulation film 116 serving as isolation is formed by local oxidation of silicon (LOCOS). More specifically, thermal oxidation is performed so as to grow a portion of the silicon oxide film 120 that is not covered with the silicon nitride film 121, so that the insulation film 116 serving as isolation is formed. At this time, a portion of the silicon oxide film 120 that is covered with the silicon nitride film 121 becomes a gate insulation film 115. After that, the resist pattern is removed, and a p-type impurity (e.g., arsenic) is ion-implanted to the semiconductor substrate 101, whereby a p-type well 114 is formed.

Next, as shown in FIG. 8C, after the silicon nitride film 121 is completely removed, a resist pattern 122 having an aperture corresponding to the formation region of a drain region 107 is formed on the semiconductor substrate 101. At this time, the insulation film 116 serving as isolation is covered with the resist pattern 122. Following this, phosphorus (P) as impurity is ion-implanted, whereby the drain region 107 is formed. The ion-implantation in this step is performed under the conditions of the implantation energy (acceleration voltage) of 170 keV and the dose of $1.0 \times 10^{13}$ ions/cm$^2$, for example. Thereafter, the resist pattern 122 is removed.

Next, as shown in FIG. 8D, a channel region 109 and a barrier region 106 are formed, and thereafter a first-layer horizontal transfer electrode 110 is formed. More specifically, the channel region 109 and the barrier region 106 are formed as follows. Firstly, a resist pattern having apertures corresponding to the formation regions of the channel region 109 and the barrier region 106 is formed, followed by ion-implantation of a n-type impurity (e.g., phosphors). Then, after this resist pattern is removed, a new resist pattern having an aperture corresponding to the formation region of the barrier region 106 only is formed, followed by ion-implantation of a p-type impurity (e.g., boron). The first-layer horizontal transfer electrode 110 can be formed by deposition of a polysilicon film, formation of a resist pattern and etching.

Next, as shown in FIG. 8E, a silicon oxide film 119a is formed on the first-layer horizontal transfer electrode 110 by thermal oxidation. Following this, although not illustrated, a second-layer horizontal transfer electrode 111 is formed using polysilicon. Next, a silicon oxide film 119b is formed, and then a contact 117 and an aluminum wiring 118 are formed successively, whereby a solid-state imaging device can be obtained.

In the above-stated solid-state imaging device, as the number of pixels is increased, the number of the horizontal transfer electrodes is increased, so that the surplus electric charge amount is increased as well. Therefore, the discharging capability of the surplus electric charge by the drain region 107 should be improved. It can be considered that the discharging capability of the surplus electric charge by the drain region 107 can be improved by increasing an impurity density of the drain region 107, i.e., by increasing the dose of the ion-implantation for the drain region 107.

However, when the dose is increased, a semiconductor region (e.g., a source/drain region of a MOS transistor constituting a peripheral circuit such as a protective circuit), which can be formed by the same process as that for the drain region 107 before increasing the dose, has to be formed by a different process, and therefore the cost for a solid-state imaging device will be increased. Further, as the dose is increased, the dielectric breakdown strength (withstand voltage) of the gate insulation film 115 will be degraded. Therefore, there is a limit to the improvement of the discharging capability by increasing the impurity density of the drain region 107. For that reason, the capability of discharging surplus electric charge by the drain region 107 has been improved by enlarging the area of the drain region 107, more specifically, by enlarging the drain region 107 in the vertical direction.

However, when the drain region 107 is enlarged in the vertical direction (the lateral direction on the sheet of FIG. 7), the area of the drain region 107 contacting with the gate insulation film 115 increases accordingly, thus increasing a load capacity at the drain region 107. Further, the distance L (see FIG. 7) from the end of the drain region 107 on the horizontal CCD side to the contact 117 as a voltage application point also increases. As a result, power consumption at the drain region 107 will increase, which makes it difficult to satisfy the request of low power consumption for digital still cameras and the like.

Therefore, with the foregoing in mind, it is an object of the present invention to provide a solid-state imaging device that suppresses an increase in power consumption at a drain region and to provide a method for manufacturing such a solid-state imaging device.

SUMMARY OF THE INVENTION

In order to achieve the above-stated object, a solid-state imaging device of the present invention includes a semiconductor substrate including: a plurality of light-receptive portions that are arranged one-dimensionally or two-dimensionally; a vertical transfer portion that transfers signal electric charge read out from the light-receptive portions in a vertical direction; a horizontal transfer portion that transfers the signal electric charge transferred by the vertical transfer portion in a horizontal direction; a barrier region adjacent to the horizontal transfer portion, the barrier region letting only surplus electric charge of the horizontal transfer portion pass therethough; a drain region adjacent to the barrier region, into which the surplus electric charge passing through the barrier region is discharged; and an insulation film adjacent to the drain region. A portion of the drain region is located beneath the insulation film.

Further, in order to achieve the above-stated object, a method of the present invention is for manufacturing a solid-state imaging device including a semiconductor substrate including: a plurality of light-receptive portions that are arranged one-dimensionally or two-dimensionally; a vertical transfer portion that transfers signal electric charge read out from the light-receptive portions in a vertical direction; a horizontal transfer portion that transfers the signal electric charge transferred by the vertical transfer portion in a horizontal direction; a barrier region adjacent to the horizontal transfer portion, the barrier region letting only surplus electric charge of the horizontal transfer portion pass therethough; a drain region adjacent to the barrier region, into which the surplus electric charge passing through the barrier region is discharged; and an insulation film adjacent to the drain region. The method includes the step of: after forming the insulation film, ion-implanting an impurity at a region sandwiched between a formation region of the barrier region and the insulation film and a portion of the insulation film on a side of the barrier region so as to form the drain region. The ion-implanting is conducted by setting implantation conditions so that the impurity penetrates through the insulation film and the drain region is formed beneath the insulation film.

As stated above, according to the solid-state imaging device and the manufacturing method of the same of the present invention, the drain region is formed, unlike a conventional device, not only at a region between the barrier region and the insulation film but also over a region beneath the insulation film. Therefore, the area of the drain region can be enlarged without increasing the contacting area of the drain region with the gate insulation film (see FIG. 7). As a result, the capability of discharging surplus electric charge by the drain region can be improved while suppressing an increase in power consumption at the drain region. Thus, when the solid-state imaging device according to the present invention is used in a digital still camera or the like, an increase in the number of pixels and a decrease in power consumption can be achieved at the same time.

BRIEF DESCRIPTION OF THE DRAWINGS

FIG. 2 shows a method for manufacturing the solid-state imaging device according to Embodiment 1 of the present invention in cross section, in which FIGS. 2A to 2E show a series of major manufacturing steps.

FIG. 4 shows a method for manufacturing the solid-state imaging device according to Embodiment 2 of the present invention in cross section, in which

FIG. 8 shows a method for manufacturing a conventional solid-state imaging device in cross section, in which

DETAILED DESCRIPTION OF THE INVENTION

Figure 1:
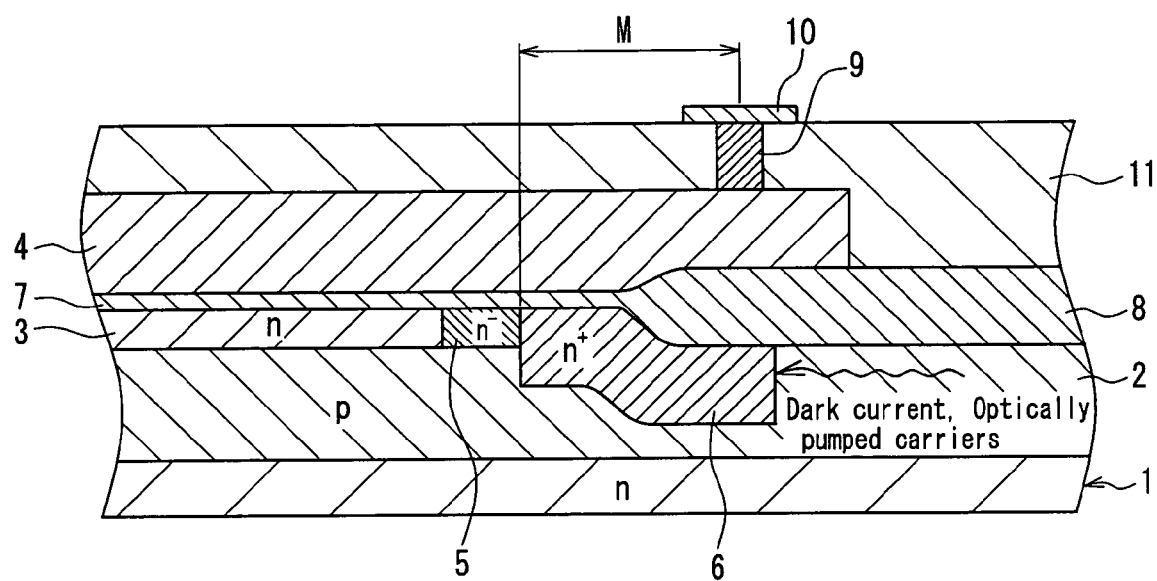
FIG. 1 is a cross-sectional view schematically showing the configuration of a solid-state imaging device according to Embodiment 1 of the present invention.

A solid-state imaging device of the present invention includes a semiconductor substrate including: a plurality of light-receptive portions that are arranged one-dimensionally or two-dimensionally; a vertical transfer portion that transfers signal electric charge read out from the light-receptive portions in a vertical direction; a horizontal transfer portion that transfers the signal electric charge transferred by the vertical transfer portion in a horizontal direction; a barrier region adjacent to the horizontal transfer portion, the barrier region letting only surplus electric charge of the horizontal transfer portion pass therethough; a drain region adjacent to the barrier region, into which the surplus electric charge passing through the barrier region is discharged; and an insulation film adjacent to the drain region. A portion of the drain region is located beneath the insulation film.

In the above-stated solid-state imaging device of the present invention, it is preferable that a diffusion layer depth of the portion of the drain region located beneath the insulation film is larger than a diffusion layer depth of the other portion of the drain region.

In this case, the drain region reaches a deeper position of the semiconductor substrate than in the conventional one. Therefore, electric charge such as dark current and optically pumped carriers from the periphery of the semiconductor substrate, which become a factor of noise, are captured more easily in the drain region. Thus, a higher quality of the captured image can be realized than in the conventional one.

In the above-stated solid-state imaging device of the present invention, it is preferable that the horizontal transfer portion has a horizontal transfer electrode overlapping with the drain region and the insulation film in a thickness direction of the semiconductor substrate, and a voltage for driving the horizontal transfer electrode is applied at a position where the horizontal transfer electrode overlaps with the portion of the drain region located beneath the insulation film in the thickness direction of the semiconductor substrate.

When the number of pixels is increased, the driving speed of horizontal CCD has to be increased. In the case of a conventional device, when the number of pixels is increased, the drain region will be enlarged and the distance between the end of the drain region on the horizontal CCD side and the voltage application point will be increased because of its configuration. As a result, a wiring resistance due to the horizontal transfer electrode also will be increased, and therefore it is difficult to improve the driving speed of the horizontal CCD. On the other hand, according to the present invention, an increase in the contacting area of the drain region with the gate insulation film (see FIG. 7) can be suppressed as stated above in the case where the drain region is enlarged. Therefore, an increase in the vertical direction length of the portion of the drain region contacting with the gate insulation film also can be suppressed. Thus, with the above-state embodiment, even when the drain region is enlarged, an increase in the distance between the end of the drain region on the horizontal CCD side and the voltage application point can be suppressed. As a result, according to the above embodiment, even when the number of pixels is increased, an increase in wiring resistance due to the horizontal transfer electrode can be suppressed, and as compared with the conventional one, the driving speed of the horizontal CCD can be improved.

In the above-stated solid-state imaging device of the present invention, a transistor element may be formed on the periphery of a region where the light-receptive portions, the vertical transfer portion, the horizontal transfer portion, the barrier region, the drain region and the insulation film are provided, and the insulation film may function for isolation from the transistor element.

A method of the present invention is for manufacturing a solid-state imaging device including a semiconductor substrate including: a plurality of light-receptive portions that are arranged one-dimensionally or two-dimensionally; a vertical transfer portion that transfers signal electric charge read out from the light-receptive portions in a vertical direction; a horizontal transfer portion that transfers the signal electric charge transferred by the vertical transfer portion in a horizontal direction; a barrier region adjacent to the horizontal transfer portion, the barrier region letting only surplus electric charge of the horizontal transfer portion pass therethough; a drain region adjacent to the barrier region, into which the surplus electric charge passing through the barrier region is discharged; and an insulation film adjacent to the drain region. The method includes the step of: after forming the insulation film, ion-implanting an impurity at a region sandwiched between a formation region of the barrier region and the insulation film and a portion of the insulation film on a side of the barrier region so as to form the drain region. The ion-implanting is conducted by setting implantation conditions so that the impurity penetrates through the insulation film and the drain region is formed beneath the insulation film.

Preferably, the above-stated solid-state imaging device manufacturing method of the present invention further includes the step of: forming a film having a capability of inhibiting passage of the impurity that is equivalent to a capability of the insulation film at the region sandwiched between the formation region of the barrier region and the insulation film. In such an embodiment, the impurity density of a portion where the implantation is not conducted via the insulation film can be made equal to the impurity density of a portion where the implantation is conducted via the insulation film. Thus, the uniformity of the impurity density at the drain region can be enhanced.

Further, in the above-stated solid-state imaging device manufacturing method of the present invention, it is preferable that the drain region is formed by ion-implantation conducted plural times, each having a different acceleration voltage. In such an embodiment also, the impurity density of a portion where the implantation is not conducted via the insulation film can be made equal to the impurity density of a portion where the implantation is conducted via the insulation film. Thus, with this embodiment also, the uniformity of the impurity density at the drain region can be enhanced.

Further, in the above-stated solid-state imaging device manufacturing method of the present invention, it is preferable that the ion-implanting allows a semiconductor region of a transistor element to be formed on the periphery of a region where the light-receptive portions, the vertical transfer portion, the horizontal transfer portion, the barrier region, the drain region and the insulation film are formed, concurrently with the formation of the drain region.

With the above-stated embodiment, a source/drain region of a CMOS transistor, for example, constituting a peripheral circuit such as a protective circuit can be formed concurrently with the drain region. Thus, an increase in number of the steps required for manufacturing a solid-state imaging device can be suppressed, and therefore an increase in manufacturing cost for a solid-state imaging device also can be suppressed.

Embodiment 1

Hereinafter, a solid-state imaging device and a manufacturing method of a solid-state imaging device according to Embodiment 1 of the present invention are described, with reference to FIGS. 1 and 2. Firstly, referring to FIG. 1, the configuration of the solid-state imaging device of Embodiment 1 is described below. FIG. 1 is a cross-sectional view schematically showing the configuration of the solid-state imaging device according to Embodiment 1 of the present invention.

As shown in FIG. 1, the solid-state imaging device of Embodiment 1 is a CCD type solid-state imaging device, which has a semiconductor substrate 1. Although not illustrated in FIG. 1, similarly to the conventional example of FIGS. 5 to 7, the semiconductor substrate 1 is provided with a plurality of two-dimensionally arranged light-receptive portions and a vertical transfer portion arranged along each column of the light-receptive portions in the vertical direction. In addition, a horizontal transfer portion is provided adjacent to the final row of the vertical transfer portion.

In Embodiment 1, the light-receptive portions are photodiodes, which store electric charge in accordance with the intensity of the received light. Each of the vertical transfer portion and the horizontal transfer portion is a CCD provided with a channel region and a transfer electrode. The vertical transfer portion transfers signal electric charge read out from the light-receptive portions in the vertical direction, and the horizontal transfer portion transfers the signal electric charge transferred by the vertical transfer portion in the horizontal direction. Note here that in FIG. 1 a part of the horizontal transfer electrode 4 constituting the horizontal transfer portion and the channel region 3 is illustrated. FIG. 1 shows a cross section taken along the line corresponding to the line A-A' of FIG. 6, which illustrates the lines appearing in the cross section only.

Further, as shown in FIG. 1, the semiconductor substrate 1 is provided with a barrier region 5, a drain region 6 and an insulation film 8 adjacent to the drain region 6. The barrier region 5 is a potential barrier, which is formed so as to let only surplus electric charge of the horizontal transfer portion pass therethrough. The barrier region 5 is formed at a position adjacent to the horizontal transfer portion. The drain region 6 is a region for discharging the surplus electric discharge passing through the barrier region 5, and is formed adjacent to the barrier region 5.

Figure 5:
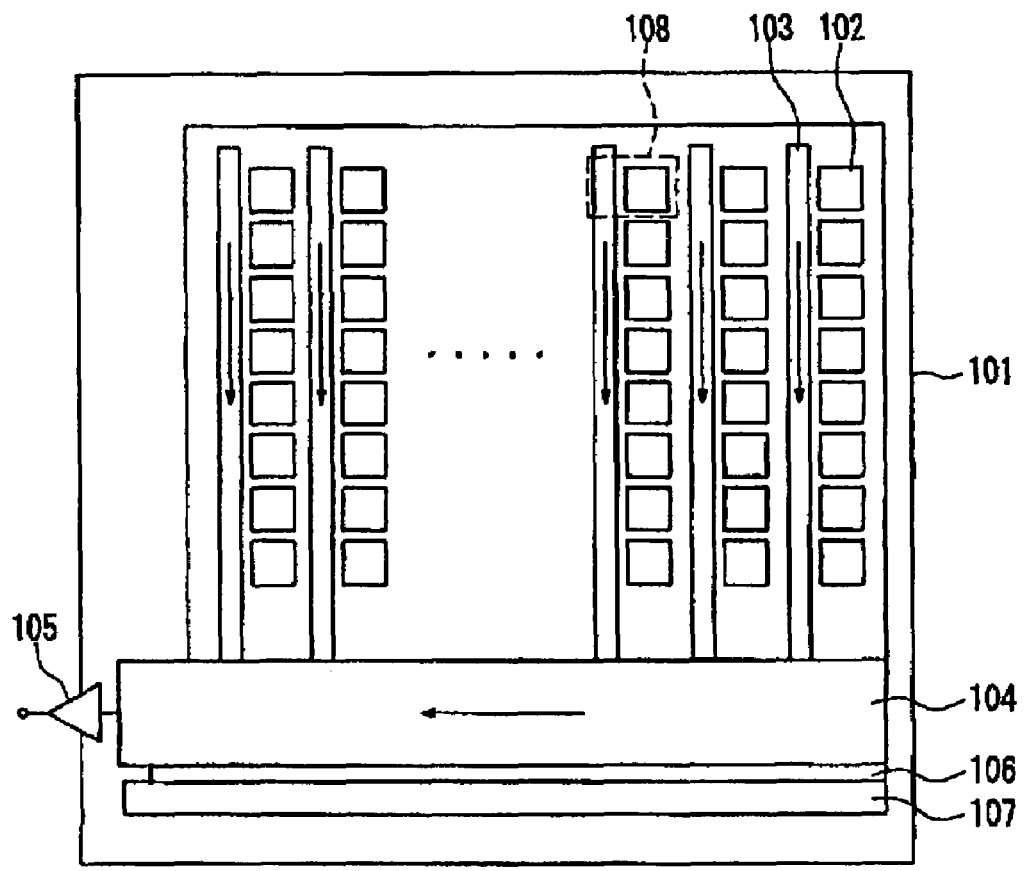
FIG. 5 is a plan view schematically showing the configuration of a conventional CCD type solid-state imaging device.
Figure 6:
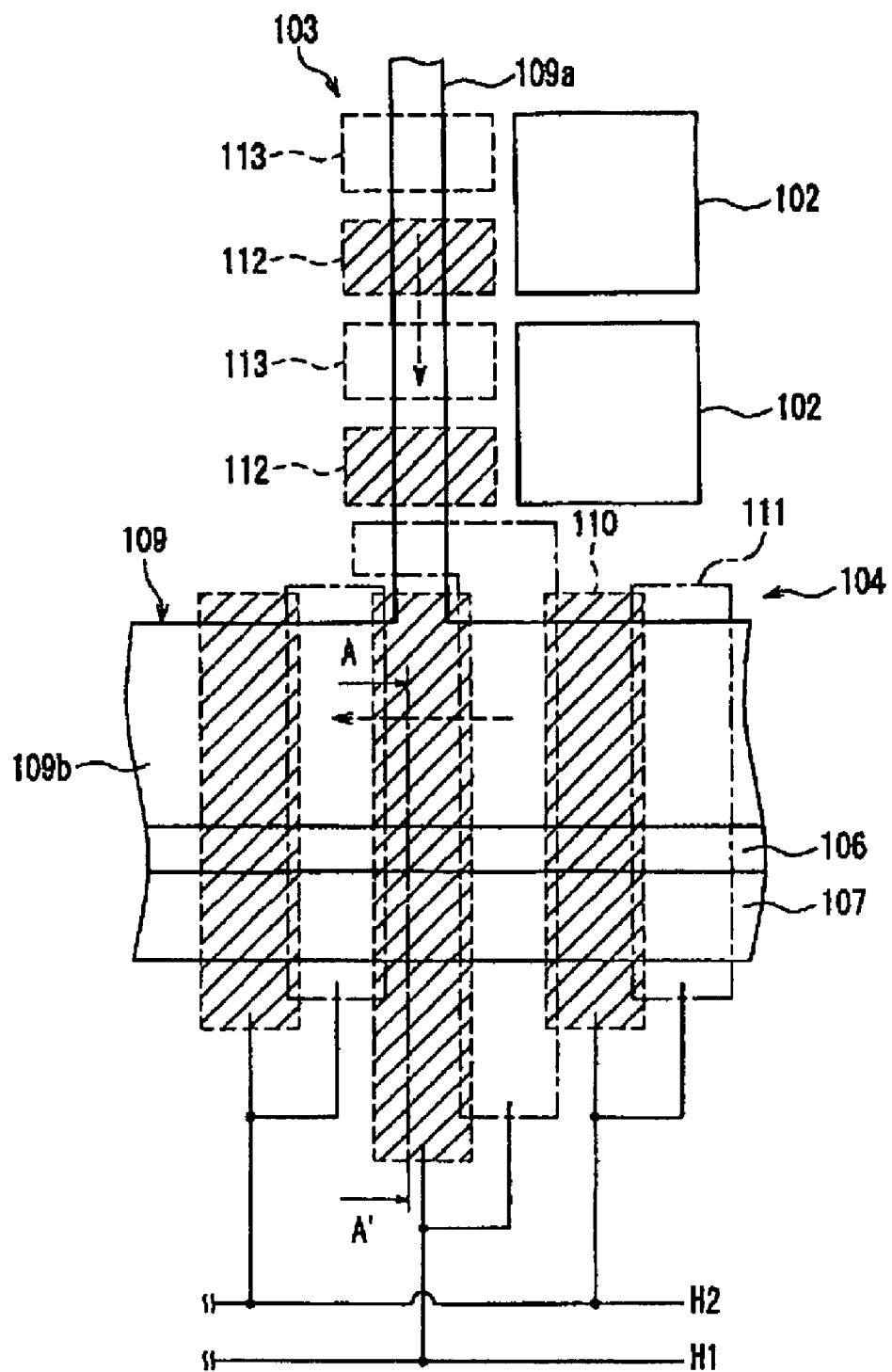
FIG. 6 is an enlarged partial plan view of the conventional CCD type solid-state imaging device of FIG. 5.
Figure 7:
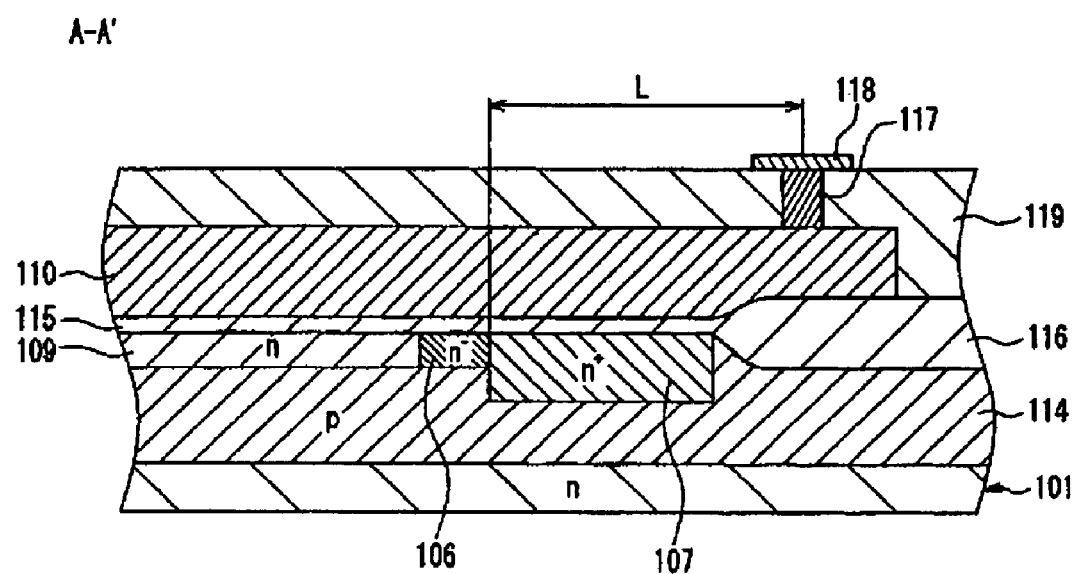
FIG. 7 shows a partial cross-sectional configuration of the conventional CCD type solid-state imaging device.

In Embodiment 1, similarly to the conventional example of FIGS. 5 to 7, the barrier region 5 and the drain region 6 are formed to extend in the horizontal direction. The barrier region 5, the drain region 6 and the insulation film 8 are disposed on the opposite side to the side where the horizontal transfer portion faces the vertical transfer portion and are arranged in this stated order toward the direction farther away from the horizontal transfer portion.

In Embodiment 1, similarly to the conventional example of FIG. 5, the insulation film 8 serves for isolation from a peripheral circuit such as a protective circuit (not illustrated in FIG. 1), and the insulation film 8 actually is formed so as to surround the whole major portion including the plurality of light-receptive portions, the vertical transfer portion, the horizontal transfer portion, the barrier region 5, the drain region 6 and the like. A transistor element (not illustrated in FIG. 1) constituting the peripheral circuit is formed on the periphery of a region where the light-receptive portions, the vertical transfer portion, the horizontal transfer portion, the barrier region 5, the drain region 6 and the insulation film 8 are provided.

In Embodiment 1, the semiconductor substrate 1 is a n-type silicon substrate, on which a p-type well 2 is formed. The channel region 3, the barrier region 5 and the drain region 6 are n-type diffusion layers, and they are formed at a region where the p-type well 2 is provided. Further, a gate insulation film 7 is formed on these regions. The horizontal transfer electrode 4 is formed so as to overlap with the barrier region 5, the drain region 6 and the insulation film 8 along the vertical direction. The horizontal transfer electrode 4 is covered with an insulation film 11. Voltage is applied to the horizontal transfer electrode 4 via a contact 9 provided in the insulation film 11 and an aluminum wiring 10 provided on the contact 9.

In this way, although the solid-state imaging device of Embodiment 1 has the configuration common to that of the conventional solid-state imaging device of FIGS. 5 to 7, they are different in the following points.

As shown in FIG. 1, unlike the conventional example of FIGS. 5 to 7, the drain region 6 in Embodiment 1 is formed so that a part of the drain region 6 is located beneath the insulation film 8, i.e., gets under the insulation film 8. Therefore, the area of the drain region 6 can be enlarged without increasing the contacting area of the drain region 6 with the gate insulation film 7. Thus, the capability of discharging surplus electric charge by the drain region 6 can be improved while suppressing an increase in power consumption at the drain region 6. Therefore, when the solid-state imaging device of Embodiment 1 is used in a digital still camera or the like, an increase in the number of pixels and a decrease in power consumption can be achieved at the same time.

Furthermore, in the case where the capability of discharging surplus electric charge by the drain region 6 of the solid-state imaging device according to Embodiment 1 is made equivalent to that of the conventional solid-state imaging device, a region for allowing the application of voltage to the horizontal transfer electrode 4 can be enlarged as compared with the conventional one. Therefore, according to Embodiment 1, the flexibility of the design of the contact 9 and the aluminum wiring 10 can be enhanced.

In addition, in Embodiment 1, the connection between the contact 9 and the horizontal transfer electrode 4 is established at a position where the contact 9 overlaps with the portion of the drain region 6 located beneath the insulation film 8 in the thickness direction of the semiconductor substrate 1. A driving voltage is applied to the horizontal transfer electrode 4 at this position. Further, in the case where the capability of discharging surplus electric charge by the drain region 6 of the solid-state imaging device according to Embodiment 1 is made equivalent to that of the conventional solid-state imaging device, the length of the portion of the drain region 6 contacting with the gate insulation film 7 in the vertical direction is shorter than that of the conventional example. Therefore, the distance M from the end of the drain region 6 on the horizontal transfer portion side to the voltage application point is shorter than the distance L (see FIG. 7) of the conventional example.

From this, according to the solid-state imaging device of Embodiment 1, even in the case where the number of pixels is increased, an increase in wiring resistance due to the horizontal transfer electrode 4 can be suppressed, and therefore as compared with the conventional case, a driving speed of the horizontal transfer portion can be enhanced.

Further, in Embodiment 1, as shown in FIG. 1, the drain region 6 is formed so that the diffusion layer depth at the portion located beneath the insulation film 8 is larger than the diffusion layer depth at the other portion. The drain region 6 reaches a deeper position of the semiconductor substrate 1 than in the conventional one. Therefore, electric charge such as dark current and optically pumped carriers from the periphery of the semiconductor substrate 1, which become a factor of noise, is captured more easily in the drain region 6. Thus, the solid-state imaging device of Embodiment 1 can realize a higher quality of the captured image than in the conventional one.

Referring now to FIG. 2, a method for manufacturing the solid-state imaging device according to Embodiment 1 of the present invention is described below. FIG. 2 shows a method for manufacturing the solid-state imaging device according to Embodiment 1 of the present invention in cross section. FIGS. 2A to 2E show a series of major manufacturing steps. Note here that FIG. 2 shows major manufacturing steps of a transistor element (MOS transistor) constituting a peripheral circuit, in addition to major manufacturing steps of the portion shown in FIG. 1. FIG. 2 illustrates the lines appearing in the cross section only.

Firstly, as shown in FIG. 2A, on a top surface of a semiconductor substrate (n-type silicon substrate) 1, a silicon oxide film ($SiO_2$) 21 with a thickness of 50 nm, for example, and a silicon nitride film (SiN) 22 with a thickness of 160 nm, for example, are formed in this order. Following this, a resist pattern (not illustrated) having apertures corresponding to the formation regions of insulation films 8 and 24 serving as isolation is formed, followed by etching, whereby a portion of the silicon nitride film 22 is removed.

Next, as shown in FIG. 2B, the insulation films 8 and 24 serving for isolation are formed by local oxidation of silicon (LOCOS). More specifically, thermal oxidation is performed so as to grow portions of the silicon oxide film 21 that are not covered with the silicon nitride film 22 to have a thickness of 400 nm, so that the insulation films 8 and 24 serving for isolation are formed. At this time, a portion of the silicon oxide film 21 that is covered with the silicon nitride film 22 becomes a gate insulation film 7 or a gate insulation film 23 for the MOS transistor. After that, the resist pattern is removed, and a p-type impurity (e.g., arsenic) is ion-implanted to the semiconductor substrate 1, whereby a p-type well 2 is formed.

Next, as shown in FIG. 2C, in order to avoid an increase in the number of the manufacturing steps, a drain region 6 and semiconductor regions 26a and 26b of the MOS transistor are formed in the same step. More specifically, a resist pattern 25 having apertures corresponding to the formation region of the drain region 6 and the formation regions of the semiconductor regions 26a and 26b of the MOS transistor is formed on the semiconductor substrate 1. At this time, a portion of the insulation film 8 on the side of the MOS transistor and the insulation film 24 are covered with the resist pattern 25. On the other hand, a region sandwiched between the formation region of a barrier region 5 and the insulation film 8 and a portion of the insulation film 8 on the side of the barrier region 5 are not covered with the resist pattern 25. Following this, an impurity such as phosphorus (P) is ion-implanted. Thereby, the drain region 6 and the semiconductor regions 26a and 26b of the MOS transistor can be formed at the same time.

Note here that in Embodiment 1 the ion-implantation has to be conducted so that the impurity penetrates the insulation film 8 to form the drain region 6 beneath the insulation film 8. Further, since the semiconductor regions 26a and 26b of the MOS transistor are formed in the step common to the drain region 6, there is an upper limit on the dose. For those reasons, in the step shown in FIG. 2C, preferably, the ion-implantation condition is set at a similar level to the conventional one concerning the dose and the implantation energy (acceleration voltage) is set higher than the conventional one. More specifically, as preferable ion-implantation conditions, the implantation energy is set at 300 keV to 500 keV, particularly at 400 keV, and the dose is set at $0.5 \times 10^{13}$ ions/cm$^2$ to $8.0 \times 10^{13}$ ions/cm$^2$, particularly at $1.0 \times 10^{13}$ ions/cm$^2$.

In the case where an impurity is ion-implanted at some portions through the insulation film 8, the impurity density of the other portions where the impurity is not implanted through the insulation film 8 may be higher than the impurity density of the portions ion-implanted through the insulation film 8. Therefore, a film having the capability of inhibiting the passage of the impurity equivalent to the capability of the insulation film 8 preferably is formed at the region sandwiched between the formation region of the barrier region 5 and the insulation film 8 and the formation regions of the semiconductor regions 26a and 26b of the MOS transistor.

Figure 8A:
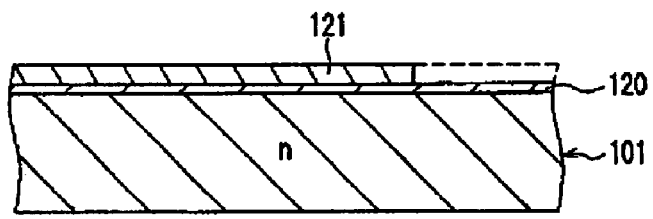
FIGS. 8A to 8E show a series of major manufacturing steps.
Figure 8B:
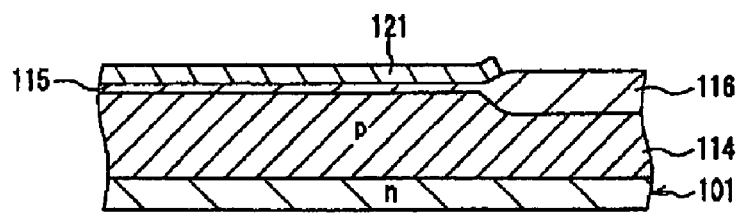
Figure 8C:
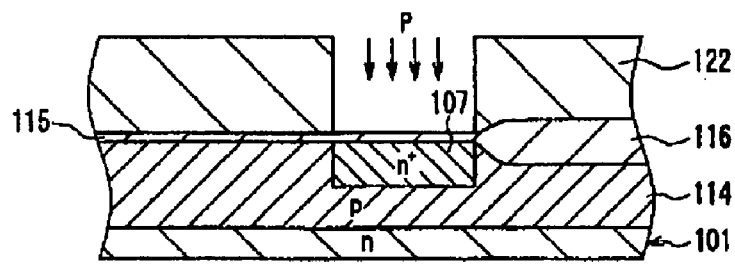
Figure 8D:
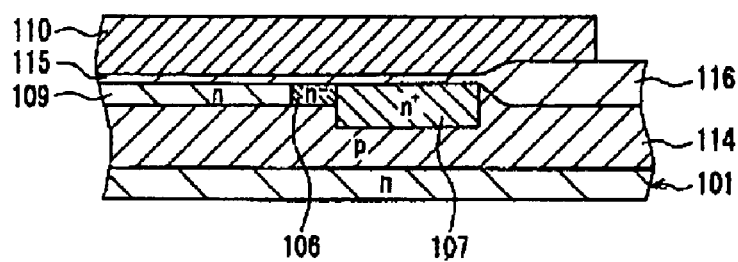
Figure 8E:
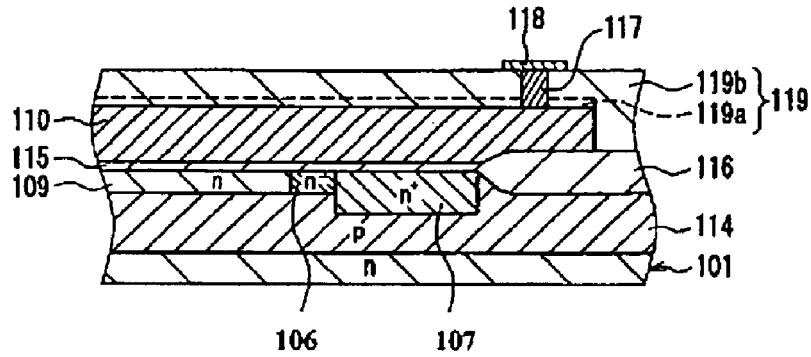

For that reason, in Embodiment 1, unlike the conventional step shown in FIG. 8C, the ion-implantation is conducted without removing the silicon nitride film 22 that is formed for thermal oxidation, as shown in FIG. 2C. In this case, the silicon nitride film 22, in combination with the gate insulation films 7 and 23, can function as a film having a capability of inhibiting the passage of the impurity equivalent to that of the insulation film 8. In Embodiment 1, the thickness of the silicon nitride film 22 is set so that the silicon nitride film 22, in combination with the gate insulation films 7 and 23, can function as a film having a capability of inhibiting the passage of the impurity equivalent to that of the insulation film 8.

Next, as shown in FIG. 2D, after the resist pattern 25 is removed, the silicon nitride film 22 further is removed. Following this, a channel region 3 and the barrier region 5 are formed. More specifically, the channel region 3 and the barrier region 5 are formed as follows. Firstly, a resist pattern having apertures corresponding to the formation regions of the channel region 3 and the barrier region 5 is formed, followed by ion-implantation of a n-type impurity (e.g., phosphors). Then, after this resist pattern is removed, a new resist pattern having an aperture corresponding to the formation region of the barrier region 5 only is formed, followed by ion-implantation of a p-type impurity (e.g., boron).

Next, as shown in FIG. 2E, a horizontal transfer electrode 4 serving as a first-layer transfer electrode and a gate electrode 29 of the MOS transistor are formed. More specifically, after forming a polysilicon film, etching is applied thereto so as to have a desired pattern. Following this, a n-type impurity (e.g., phosphors) is ion-implanted, whereby high-density n-type semiconductor regions 27 and 28 are formed in the semiconductor regions 26a and 26b of the MOS transistor.

Next, a silicon oxide film is formed on the horizontal transfer electrode 4 by thermal oxidation. Following this, although not illustrated, a second-layer horizontal transfer electrode is formed using polysilicon, and a silicon oxide film is formed. Thereby, an insulation film 11 is obtained. After that, a contact 9 and an aluminum wiring 10 are formed successively, whereby a solid-state imaging device can be obtained. Further, a contact 30 and an aluminum wiring 33 are formed for applying voltage to the semiconductor region 26a of the MOS transistor, a contact 32 and an aluminum wiring 34 are formed for applying voltage to the gate electrode 29 and a contact 31 and an aluminum wiring 35 are formed for applying voltage to the semiconductor region 26b.

In this way, according to the method for manufacturing a solid-state imaging device of Embodiment 1, the capability of the drain region 6 to discharge surplus electric charge can be enhanced without increasing a dose of the formation of the drain region 6. Further, the semiconductor regions 26a and 26b of the MOS transistor constituting a peripheral circuit and the drain region 6 can be formed in the same step.

Embodiment 2

Figure 3:
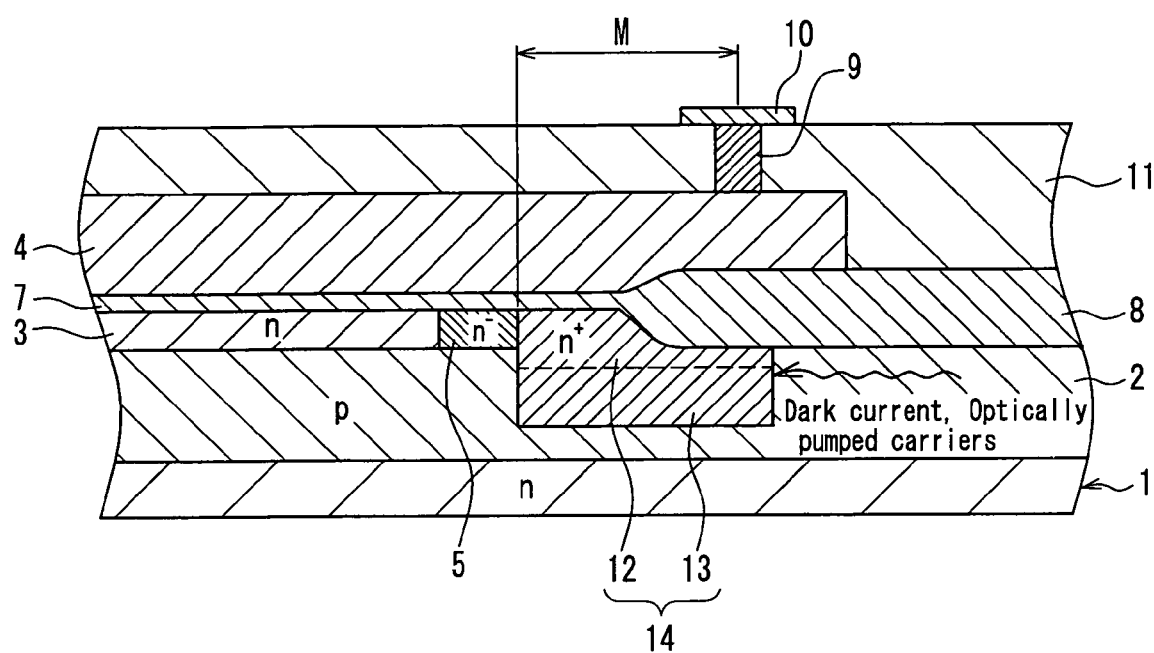
FIG. 3 is a cross-sectional view schematically showing the configuration of a solid-state imaging device according to Embodiment 2 of the present invention.

The following describes a solid-state imaging device and a manufacturing method of a solid-state imaging device according to Embodiment 2 of the present invention, with reference to FIGS. 3 and 4. FIG. 3 is a cross-sectional view schematically showing the configuration of the solid-state imaging device according to Embodiment 2 of the present invention.

As shown in FIG. 3, in the solid-state imaging device of Embodiment 2, a diffusion layer depth that is not located beneath an insulation film 8 in a drain region 14 is larger than that of Embodiment 1. In other words, in the solid-state imaging device of Embodiment 2, the drain region 14 is formed so that the depth of the diffusion layer beneath the insulation film 8 and the depth of the diffusion layer at the other portion are the same or substantially the same. Further, the impurity density of the drain region 14 is uniform. Therefore, according to Embodiment 2, the capability of the drain region 14 of discharging surplus electric charge can be further enhanced.

Figure 4A:
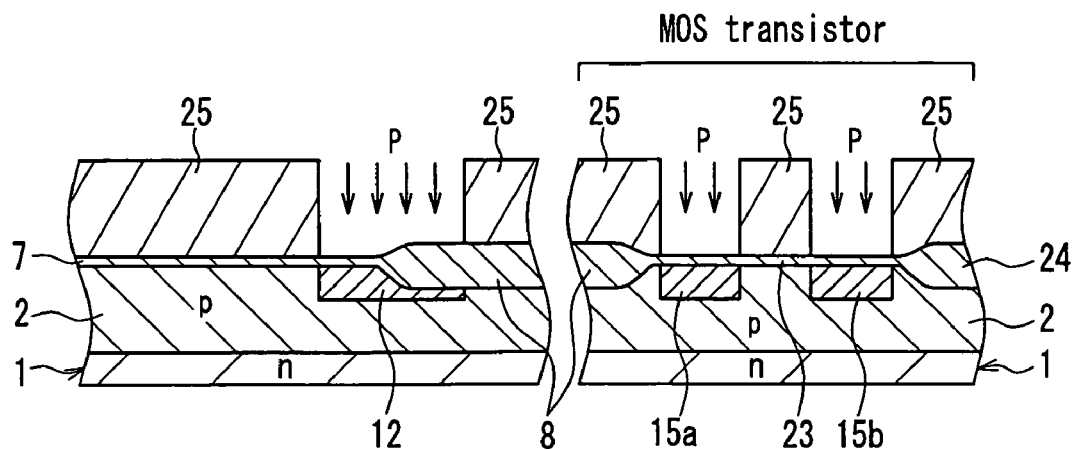
FIGS. 4A to 4C show a series of major manufacturing steps.
Figure 4B:
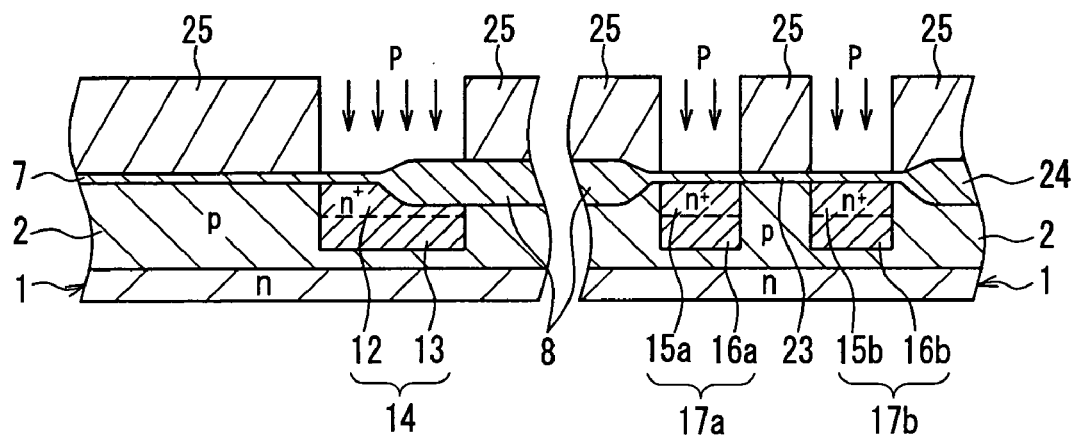
Figure 4C:
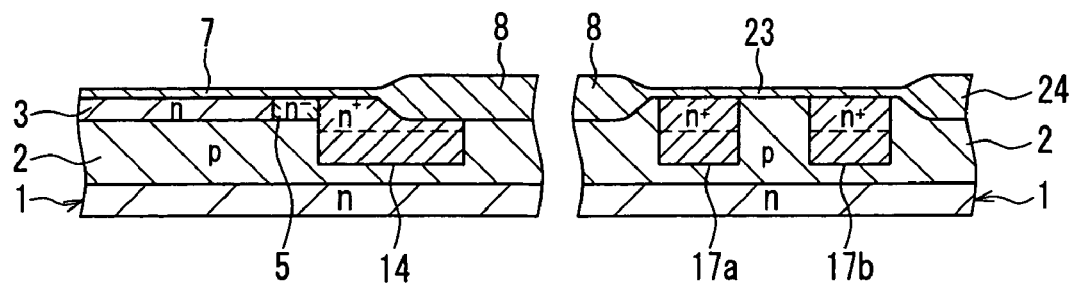

FIG. 4 shows a method for manufacturing the solid-state imaging device according to Embodiment 2 of the present invention in cross section. FIGS. 4A to 4C show a series of major manufacturing steps. Note here that FIG. 4 shows major manufacturing steps of a transistor element (MOS transistor) constituting a peripheral circuit, in addition to major manufacturing steps of the portion shown in FIG. 3. FIG. 4 illustrates the lines appearing in the cross section only.

Firstly, the steps shown in FIGS. 2A and 2B in Embodiment 1 are performed, whereby insulation films 8 and 24 serving as isolation and a p-type well 2 are formed on a semiconductor substrate 1. In Embodiment 2, however, the silicon nitride film (see FIG. 2B) is removed after the formation of the insulation films 8 and 24.

Next, as shown in FIG. 4A, a resist pattern 25 having apertures corresponding to the formation region of the drain region 14 and the formation regions of semiconductor regions 17a and 17b of the MOS transistor is formed on the semiconductor substrate 1. At this time, a portion of the insulation film 8 on the side of the MOS transistor and the insulation film 24 are covered with the resist pattern 25. On the other hand, a region sandwiched between the formation region of a barrier region 5 and the insulation film 8 and a portion of the insulation film 8 on the side of the barrier region 5 are not covered with the resist pattern 25. The manufacturing method up to this step is similar to the step shown in FIG. 2C in Embodiment 1.

Following this, an impurity such as phosphorus (P) is ion-implanted. Note here that in Embodiment 2 the ion-implantation for forming the drain region 14 and the semiconductor regions 17a and 17b are conducted by dividing it into two steps. FIG. 4A shows the first ion-implantation only. The first ion-implantation is conducted at a low acceleration, for example, the implantation energy (acceleration voltage) is set at 170 keV.

As a result, shallow diffusion regions (semiconductor regions) 12, 15a and 15b are formed at the formation region of the drain region 14 and the formation regions of the semiconductor regions 17a and 17b of the MOS transistor. Herein, the dose in this step may be set at a value similar to that for the step of FIG. 2C in Embodiment 1.

Next, as shown in FIG. 4B, the second ion-implantation is conducted using the same impurity as that in the case of FIG. 4A. The second ion-implantation is conducted at a higher acceleration than the first ion-implantation, for example, the implantation energy is set at 400 keV. As a result, deep diffusion regions (semiconductor regions) 13, 16a and 16b are formed beneath the shallow diffusion regions (semiconductor regions) 12, 15a and 15b, respectively, whereby the drain region 14 and the semiconductor regions 17a and 17b of the MOS transistor can be obtained. Herein, the dose in this step also may be set at a value similar to that for the step of FIG. 2C in Embodiment 1.

In this way, in Embodiment 2, the drain region 14 is formed by the ion-implantation divided into plural times having different acceleration voltages (implantation energies). As a result, without the requirement to form a film having a capability of inhibiting the passage of an impurity that is equivalent to the insulation film 8 at the region sandwiched between the formation region of the barrier region 5 and the insulation film 8 and at the formation regions of the semiconductor regions 17a and 17b of the MOS transistor, the impurity density of the drain region 14 can be made uniform. Further, since the diffusion depth in the drain region 14 can be increased, the capability of the drain region 14 to discharge surplus electric charge can be enhanced.

Herein, in the example shown in Embodiment 2, the ion-implantation for forming the drain region 14 is conducted twice. However, the number of the times of the ion-implantation is not limited to this. Further, in the example shown in Embodiment 2, the acceleration voltage is set higher in the last ion-implantation than in the first ion-implantation, which is a non-limiting example. The acceleration voltage may be set higher in the first ion-implantation than in the last ion-implantation.

Next, as shown in FIG. 4C, after the resist pattern 25 is removed, a channel region 3 and the barrier region 5 are formed. Note here that the step shown in FIG. 4C is similar to the step shown in FIG. 2D in Embodiment 1.

After that, the step shown in FIG. 2E in Embodiment 1 is conducted. Thereby, a horizontal transfer electrode, a gate electrode of the MOS transistor, an insulation film, a contact and an aluminum wiring (not illustrated in FIG. 4) are formed, whereby the solid-state imaging device shown in FIG. 3 can be obtained.

Note here that in the above-stated Embodiments 1 and 2 the insulation films serving as isolation are formed by local oxidation of silicon (LOCOS). However, the present invention is not limited to this. In the present invention, the insulation films serving as isolation can be formed by shallow trench isolation (STI) as well, for example.

More specifically, in the step shown in FIG. 2A, after the silicon oxide film 21 and the silicon nitride film 22 are formed, a resist pattern having apertures corresponding to the formation regions of the insulation films 8 and 24 serving as isolation is formed, followed by etching so as to form a groove having a predetermined depth in the semiconductor substrate 1. Next, an oxide film is formed on the semiconductor substrate 1 by a CVD method. The oxide film is formed so that the groove is buried in the oxide film and moreover the entire surface of the semiconductor substrate 1 is covered with the oxide film. Following this, planarization is conducted by a CMP method so that the silicon nitride film 22 is exposed. As a result, the oxide film is left in the groove, which can be the insulation films 8 and 24.

According to the present invention, a solid-state imaging device that realizes both of an increase in pixel number and a decrease in power consumption can be obtained. This solid-state imaging device is effective as the application to a digital still camera, a digital video camera, a mobile terminal and the like, and so it has an industrial applicability.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A solid-state imaging device comprising a semiconductor substrate including:
    a gate insulation film formed on the semiconductor substrate;
    a plurality of light-receptive portions that are arranged one-dimensionally or two-dimensionally;
    a vertical transfer portion that transfers signal electric charge read out from the light-receptive portions in a vertical direction;
    a horizontal transfer portion beneath the gate insulation film that transfers the signal electric charge transferred by the vertical transfer portion in a horizontal direction;
    a barrier region adjacent to the horizontal transfer portion and beneath the gate insulation film, the barrier region letting only surplus electric charge of the horizontal transfer portion pass therethrough;
    a drain region adjacent to the barrier region, into which the surplus electric charge passing through the barrier region is discharged;
    a first insulation film adjacent to the drain region; and
    a boundary region formed between the gate insulation film and the first insulation film,
    wherein the drain region extends from a point beneath the first insulation film and the boundary region and to the barrier region.

2. The solid-state imaging device according to claim 1, wherein a depth of a diffusion layer of a portion of the drain region located beneath the first insulation film is larger than a depth of a diffusion layer of the drain region located beneath the gate insulation film.

3. The solid-state imaging device according to claim 1, wherein the horizontal transfer portion has a horizontal transfer electrode overlapping with the drain region and the first insulation film in a thickness direction of the semiconductor substrate, and
    a voltage for driving the horizontal transfer electrode is applied at a position where the horizontal transfer electrode overlaps with a portion of the drain region located beneath the first insulation film in the thickness direction of the semiconductor substrate.

4. The solid-state imaging device according to claim 1, wherein a transistor element is formed on the periphery of a region where the light-receptive portions, the vertical transfer portion, the horizontal transfer portion, the barrier region, the drain region and the insulation film are provided, and
    the first insulation film functions for isolation from the transistor element.

5. The solid-state imaging device according to claim 4, wherein the transistor element is a n-type transistor element.

6. The solid-state imaging device according to claim 4, wherein phosphorus is included in the transistor element as an impurity.

7. The solid-state imaging device according to claim 4,
    wherein a gate electrode, a source region and a drain region of the transistor element are connected with a gate wiring, a source wiring and a drain wiring, respectively, via a contact.

8. The solid-state imaging device according to claim 7,
    wherein the gate wiring, the source wiring and the drain wiring comprise aluminum.

9. The solid-state imaging device according to claim 1,
    wherein a depth of a diffusion layer of the of the drain region beneath the first insulation film and the gate insulation film is larger than a depth of a diffusion layer of another portion of the semiconductor substrate.

10. The solid-state imaging device according to claim 9,
    wherein the diffusion layer of another portion of the semiconductor substrate is a diffusion layer of the barrier region.

11. The solid-state imaging device according to claim 9,
    wherein the diffusion layer of another portion of the semiconductor substrate is a diffusion layer of the horizontal transfer portion.

12. The solid-state imaging device according to claim 1,
    wherein the semiconductor substrate is a n-type silicon substrate.

13. The solid-state imaging device according to claim 1,
    wherein a p-type well is formed on the semiconductor substrate, and
    the horizontal transfer portion, the barrier region and the drain region are formed at a region where the p-type well is provided.

14. The solid-state imaging device according to claim 13, wherein arsenic is included in the p-type well as an impurity.

15. The solid-state imaging device according to claim 1,
    wherein a horizontal transfer electrode is formed on the horizontal transfer portion.

16. The solid-state imaging device according to claim 15, wherein the horizontal transfer electrode is formed on the barrier region, the drain region and the first insulation film.

17. The solid-state imaging device according to claim 15,
    wherein a distal end portion of the horizontal transfer electrode relative to the vertical transfer portion is farther from the vertical transfer portion than is a distal end portion of the drain region relative to vertical transfer portion.

18. The solid-state imaging device according to claim 15, wherein a second insulation film is formed on the horizontal transfer electrode.

19. The solid-state imaging device according to claim 18, wherein a contact is provided in the second insulation film, and the contact is connected with the horizontal transfer electrode.

20. The solid-state imaging device according to claim 19, wherein the contact is formed above the drain region.

21. The solid-state imaging device according to claim 20, wherein the wiring comprises aluminum.

22. The solid-state imaging device according to claim 19, wherein the contact is formed above the first insulation film.

23. The solid-state imaging device according to claim 19, wherein a wiring is provided on the second insulation film, and the wiring is connected with the contact.

24. The solid-state imaging device according to claim 15, wherein the horizontal transfer electrode comprises polysilicon.

25. The solid-state imaging device according to claim 15, wherein a silicon oxide film is formed on the horizontal transfer electrode.

26. The solid-state imaging device according to claim 1, wherein a silicon oxide film is formed on a surface of the semiconductor substrate.

27. The solid-state imaging device according to claim 1, wherein phosphorus is included in the drain region as an impurity.

28. The solid-state imaging device according to claim 1, wherein an impurity density of a portion of the drain region beneath the first insulation film is lower than an impurity density of a portion of the drain region beneath the gate insulation film.

29. The solid-state imaging device according to claim 1, wherein a depth of a portion of the drain region beneath the first insulating film is substantially equal to a depth of a portion of the drain region beneath the gate insulation film.

30. The solid-sate imaging device according to claim 1, wherein an impurity density of a portion of the drain region beneath the first insulation film is substantially equal to an impurity density of a portion of the drain region beneath the gate insulation film.

31. The solid-state imaging device according to claim 1, wherein the first insulation film is local oxidation of silicon.

32. The solid-state imaging device according to claim 1, wherein the first insulation film is shallow trench isolation.

33. The solid state imaging device according to claim 1, wherein the barrier region is n-type.

34. The solid state imaging device according to claim 1, wherein a concentration of the impurity of the barrier region is lower than that of the horizontal transfer portion and the drain region.

35. The solid state imaging device according to claim 1, wherein the point beneath the first insulation film is located beneath a flat area of the first insulation film.

* * * * *